United States Patent
Hsin et al.

(10) Patent No.: US 8,587,353 B2
(45) Date of Patent: Nov. 19, 2013

(54) FREQUENCY SYNTHESIZER

(71) Applicant: NOVATEK Microelectronics Corp., Hsin-Chu (TW)

(72) Inventors: Tung-Cheng Hsin, Hsinchu (TW); Hsiang-Chih Chen, Taipei (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/681,405

(22) Filed: Nov. 19, 2012

(65) Prior Publication Data
US 2013/0257496 A1    Oct. 3, 2013

(30) Foreign Application Priority Data
Mar. 27, 2012  (TW) .............................. 101110549 A

(51) Int. Cl.
*H03L 7/06*    (2006.01)

(52) U.S. Cl.
USPC ......................................... 327/156; 327/147

(58) Field of Classification Search
USPC .................................. 327/147, 156
See application file for complete search history.

(56) References Cited

U.S. PATENT DOCUMENTS

| | | | | |
|---|---|---|---|---|
| 7,215,165 | B2 * | 5/2007 | Yamamoto et al. | 327/156 |
| 8,373,462 | B2 * | 2/2013 | Ma et al. | 327/156 |
| 2004/0263226 | A1 * | 12/2004 | Kim | 327/158 |
| 2006/0290393 | A1 * | 12/2006 | Yamamoto et al. | 327/156 |
| 2007/0126484 | A1 * | 6/2007 | Lin et al. | 327/156 |
| 2008/0001640 | A1 * | 1/2008 | Choi | 327/158 |
| 2008/0143400 | A1 * | 6/2008 | Choi | 327/156 |
| 2008/0238506 | A1 * | 10/2008 | Choi | 327/158 |
| 2009/0128201 | A1 * | 5/2009 | Chen et al. | 327/149 |
| 2010/0033219 | A1 * | 2/2010 | Kim | 327/158 |
| 2011/0234278 | A1 * | 9/2011 | Seo | 327/158 |
| 2011/0234280 | A1 * | 9/2011 | Na | 327/158 |
| 2012/0293221 | A1 * | 11/2012 | Ma et al. | 327/156 |
| 2013/0038363 | A1 * | 2/2013 | Lee et al. | 327/149 |

* cited by examiner

*Primary Examiner* — Adam Houston
(74) *Attorney, Agent, or Firm* — Winston Hsu; Scott Margo

(57) ABSTRACT

The present invention discloses a frequency synthesizer. The frequency synthesizer includes a delay unit, for receiving a reference signal and delaying the reference signal according to a delay parameter, so as to generate a delay reference signal; a phase-locked loop, for generating an output signal according to the delay reference signal and a feedback frequency dividing signal; a control unit, for generating the delay parameter and a frequency dividing parameter according to a target magnification factor; and a frequency divider, for dividing the frequency of the output signal according to the frequency dividing parameter.

9 Claims, 9 Drawing Sheets

US 8,587,353 B2

FREQUENCY SYNTHESIZER

BACKGROUND OF THE INVENTION

1. Field of the Invention

The present invention relates to a frequency synthesizer, and more particularly, to a synthesizer capable of reducing jitter noise and suitable for high accuracy frequency synthesizing.

2. Description of the Prior Art

Frequency synthesizer is a device for performing frequency synthesizing, so as to output specific frequency. Common frequency synthesizer adopts the structure of sigma-delta modulating and is realized in analog method.

Please refer to FIG. 1, which is a schematic diagram of a conventional frequency synthesizer 10 with a sigma-delta modulating structure. The frequency synthesizer 10 includes a phase-locked loop 102, a frequency divider 104, and a sigma-delta modulator 106. The phase-locked loop 102 generates an output signal $S_O$ according to a reference signal $S_{REF}$ and a feedback signal $S_F$. The sigma-delta modulator 106 is utilized for controlling the frequency dividing ratio of the frequency divider 104. However, the frequency synthesizer 10 of the sigma-delta modulating structure utilizes the concept of averaging frequency for acquiring the required signal frequency and the accuracy of the frequency divider 104 is determined based on the length of the output signal $S_O$. The speed of phase locking may be slow if the accuracy of the frequency divider 104 is insufficient. In such a condition, the cost would be significantly higher for achieving an acceptable performance.

On the other hand, the variations of signals are tremendous when the sigma-delta modulator 106 modulates the frequency dividing ratio of the frequency divider 104. Thus, significant variations of the frequency dividing ratio generate considerable jitter noise. For example, assume the reference frequency $F_R$ is the frequency of the reference signal $S_{REF}$ and the frequency $F_O$ is the frequency of the output signal $S_O$. If the required output frequency $F_O$ is 5.3 times the reference frequency $F_R$ ($F_O=5.3F_R$), the sigma-delta modulator 106 controls the frequency divider 104 to selectively perform the frequency dividing procedure of 5 times and 6 times for acquiring the output signal $S_O$ with an average frequency equaling 5.3 times the reference frequency $F_R$. In such a condition, the signal variation margin reaches 20%, which results in significant jitter noise. The phase-locked loop 102 therefore needs to configure greater capacitor for filtering jitter noise. However, the configuration of the greater capacitor can lead to slower reaction speed and greater area of the integrated chip. The manufacture cost is therefore increased.

SUMMARY OF THE INVENTION

Therefore, the main goal of the present invention is providing a frequency synthesizer.

The present invention discloses a frequency synthesizer. The frequency synthesizer includes a delay unit, for receiving a reference signal and delaying the reference signal according to a delay parameter, so as to generate a delay reference signal; a phase-locked loop, for generating an output signal according to the delay reference signal and a feedback frequency dividing signal; a control unit, for generating the delay parameter and a frequency dividing parameter according to a target magnification factor; and a frequency divider, for dividing the frequency of the output signal according to the frequency dividing parameter.

The present invention further discloses a frequency synthesizer. The frequency synthesizer includes a phase-locked loop, for receiving a reference signal and generating an output signal according to the reference signal and a feedback delay signal; a control unit, for generating a delay parameter and a frequency dividing parameter according to a target magnification factor; a frequency divider, for dividing the frequency of the output signal according to the frequency dividing parameter, so as to generate a frequency dividing signal; and a delay unit, for delaying the frequency dividing signal according to the delay parameter, so as to generate the feedback delay signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
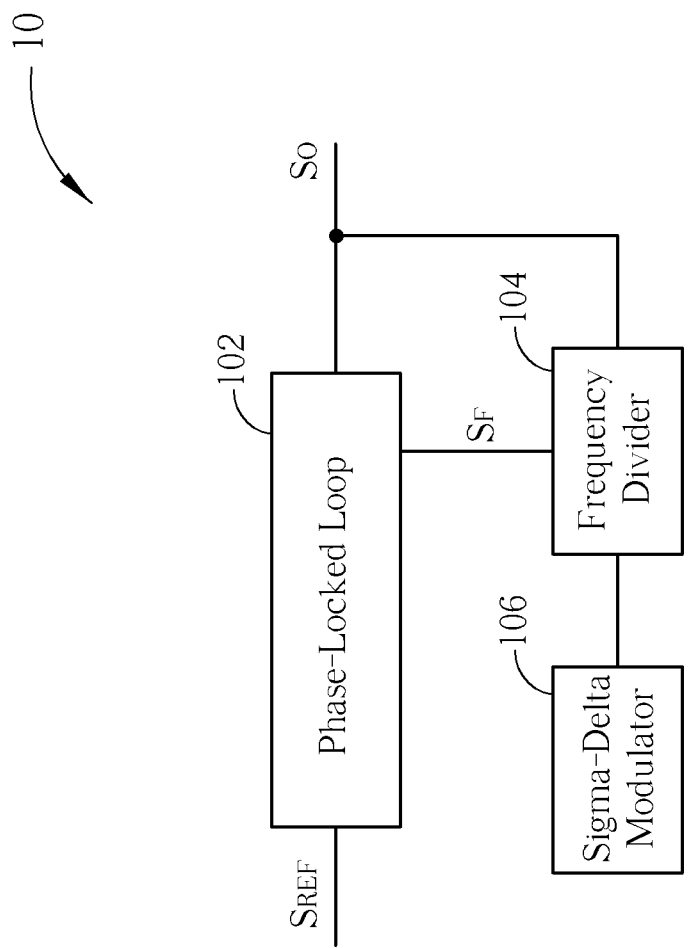
FIG. 1 is a schematic diagram of a frequency synthesizer of conventional sigma-delta modulation structure.
Figure 2:
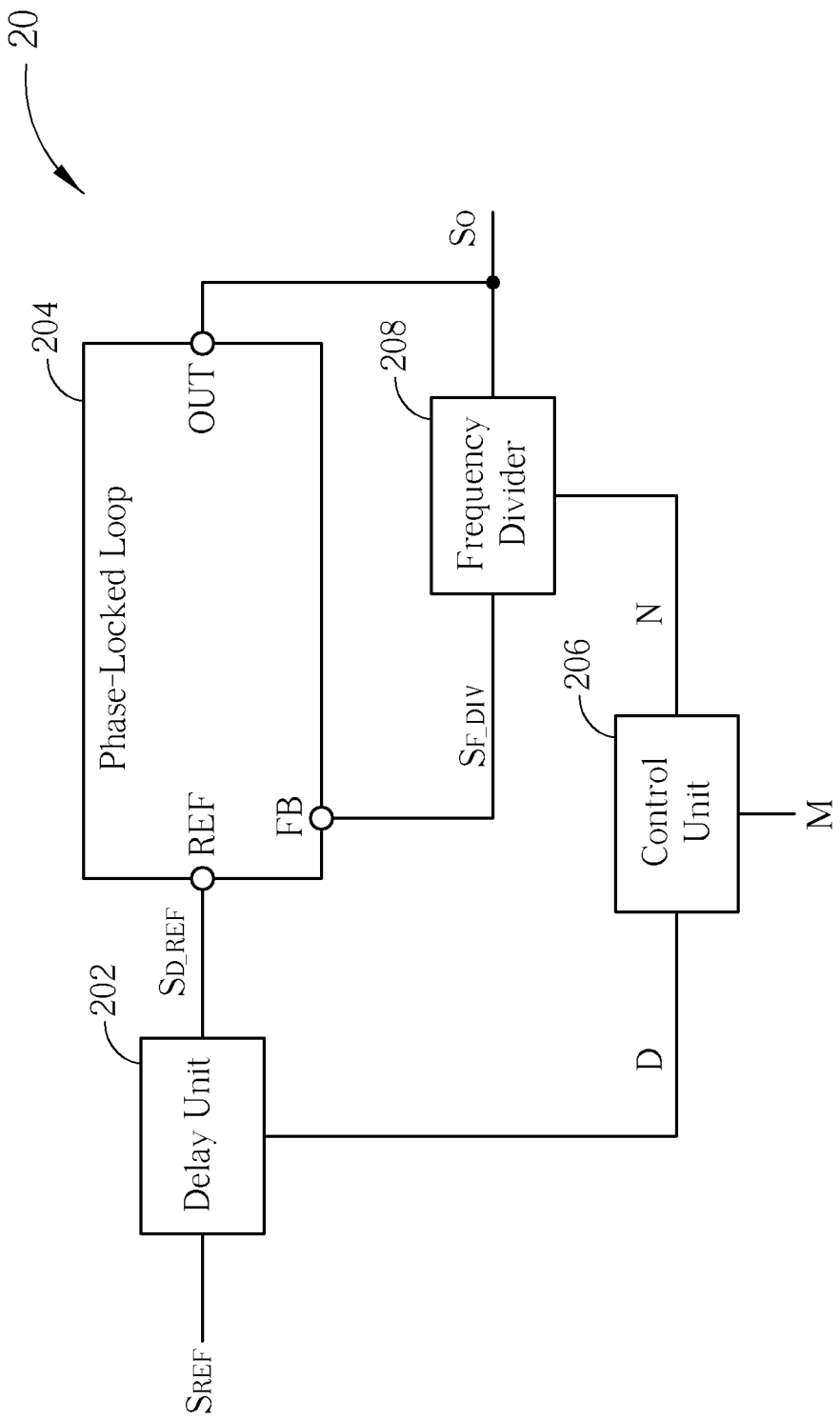
FIG. 2 is a schematic diagram of a frequency synthesizer according to a first embodiment of the present invention.

Please refer to FIG. 2, which is a schematic diagram of a frequency synthesizer 20 according to an embodiment of the present invention. The frequency synthesizer 20 comprises a delay unit 202, a phase-locked loop 204, a control unit 206 and a frequency divider 208. The delay unit 202 is utilized for receiving a reference signal SREF and delaying the reference signal $S_{REF}$ according to a delay parameter D, so as to generate a delayed reference signal $S_{D\_REF}$. The delay parameter D may be a delay phase. The phase-locked loop 204 includes an input terminal REF, a feedback terminal FB and an output terminal OUT. As shown in FIG. 2, the reference terminal REF is coupled to the delay unit 202, the feedback terminal FB is coupled to a terminal of the frequency divider 208, and the output terminal OUT is coupled to another terminal of the frequency divider. The phase-locked loop 204 is utilized for generating an output signal $S_O$ according to the delayed reference signal $S_{D\_REF}$ and a feedback frequency dividing signal $S_{F\_DIV}$. The frequency divider 208 is coupled to the feedback terminal FB and the output terminal OUT of the phase-locked loop 204, for dividing the frequency of the output signal $S_O$ according to a frequency dividing parameter N, so as to generate the corresponding feedback frequency dividing signal $S_{F\_DIV}$. The frequency dividing parameter N may be a frequency dividing radio. The control unit 206 is coupled to the delay unit 202 and the frequency divider 208, for generating the corresponding delay parameter D and the corresponding frequency dividing parameter N according to a target magnification factor M. According to different applications, the target magnification factor M may be a fixed constant or a time-variable parameter. Preferably, the target magnification factor M is a positive real number greater than one, and may be a fractional-number. Simply speaking, if the frequencies of the reference signal SREF and the output signal $S_O$ are a frequency $F_{refclk}$ and a frequency $F_{clko}$, respectively, the present invention can output the output signal $S_O$ with a required frequency at the output terminal OUT via the operations of the frequency synthesizer 20. In other words, the frequency $F_{clko}$ of the output signal $S_O$ eventually outputted by the frequency synthesizer 20 equals a product of the target magnification factor M and the frequency $F_{refclk}$ of the reference signal $S_{REF}$ ($F_{clko}$=M×$F_{refclk}$). Besides, the frequency synthesizer 20 may further includes additional frequency divider for generating the output signal $S_O$ with a frequency smaller than the frequency $F_{refclk}$ of the reference signal $S_{REF}$.

In this embodiment, the frequency synthesizer 20 with feedback structure utilizes the control unit 206 for outputting the corresponding delay parameter D and the frequency dividing parameter N to the delay unit 202 and the frequency divider 208, respectively, according to the target magnification factor M in each recursive feedback operation. After the phase-locked loop 204 generates the corresponding output signal $S_O$ according to the phase difference between the delayed reference signal $S_{D\_REF}$ and the feedback frequency dividing signal $S_{F\_DIV}$, the output signal $S_O$ is transmitted to the frequency divider 208. The frequency divider 208 performs a frequency dividing operation with an integer according to the frequency dividing parameter N, to generate the corresponding feedback frequency dividing signal $S_{F\_DIV}$. For example, if the frequency dividing parameter N indicates the frequency dividing ratio is 5, the frequency divider 208 performs the frequency dividing operations with frequency dividing ratio equaling 5, to generate the feedback frequency dividing signal $S_{F\_DIV}$ to the feedback terminal FB. In other words, the frequency divider 208 is controlled by the control unit 206 to perform the required frequency dividing operations and to provide the processed feedback frequency dividing signal $S_{F\_DIV}$ to the phase-locked loop 204. Preferably, the frequency divider 208 is a variable frequency divider, i.e. the frequency divider 208 can perform frequency dividing operations with different frequency dividing ratios. In contrast, the frequency dividing parameter N is a time-varying integer. More precisely, the present invention utilizes the control unit 206 to generate the corresponding delay parameter D and the frequency dividing parameter N according to the target magnification factor M, such that the frequency divider 208 performs the frequency dividing operations in integer ratio for realizing the integer part of the target magnification factor M. Next, the decimal part of the target magnification factor M is achieved by delay unit 202.

Overall, the present invention can adjust the required signal frequency via the cooperation of the delay unit 202 and the frequency divider 208. Since the frequency divider 208 does not need to frequently vary different frequency dividing ratios, the jitter noise is effectively reduced. Moreover, the present invention utilizes the delay unit 202 for modulating the ratio of the decimal part of the target magnification factor M, the phase variation generated at the output terminal REF or the feedback terminal FB of the phase-locked loop 204 is far less than the jitter noise generated by the conventional structure acquiring the required frequency via modulating frequency divider (generated by the large scale of frequency dividing ratio variation in the process of the frequency synthesizing). In other words, the phase noise and the phase error generated by the delay unit 202 co-operates the frequency divider 208 is extremely small in the process of recursive locking. The present invention therefore features low jitter noise and fast locking, such that the high accuracy frequency synthesizing with fractional-number frequency dividing ratio can be achieved.

Figure 3:
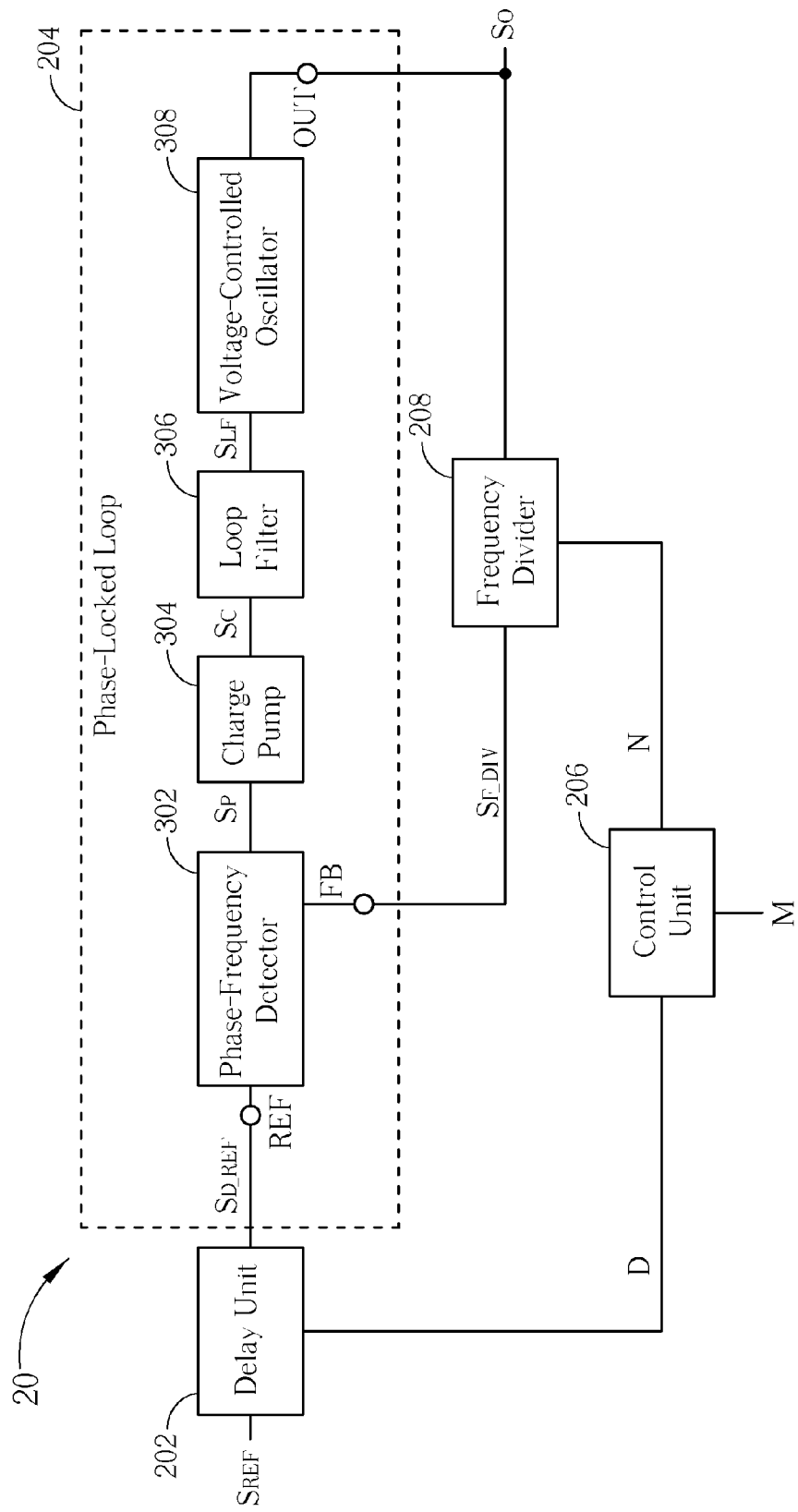
FIG. 3 is a schematic diagram of the phase-locked loop shown in FIG. 2.

On the other hand, the frequency synthesizer 20 of the present invention is suitable for frequency synthesizers of all kinds of phase-locked loop. For example, please refer to FIG. 3, which is a schematic of the phase-locked loop 204 shown in FIG. 2. As shown in FIG. 3, the phase-locked loop 204 includes a phase frequency detector 302, a charge pump 304, a loop filter 306 and a voltage-controlled oscillator 308. The phase frequency detector 302 is coupled to the reference input terminal REF and the feedback terminal FB, for receiving the delayed reference signal $S_{D\_REF}$ and the feedback frequency dividing signal $S_{F\_DIV}$ and accordingly generating a phase error signal $S_P$. The charge pump 304 is coupled to the phase frequency detector 302, for generating a control voltage signal $S_C$ according to the phase error signal Sp. The loop filter 306 is coupled to the charge pump 304, for filtering the control voltage signal $S_C$, to generate a filtering signal $S_{LF}$. The voltage-controlled oscillator 308 is coupled to the loop filter 306 and the output terminal OUT for generating the output signal $S_O$ to the output terminal OUT according to the filtering signal $S_{LF}$. Note that, the phase-locked loop 204 shown in FIG. 3 is only an embodiment of the present invention, those skilled in the art can accordingly observe various modifications and are not limited herein.

Figure 4:
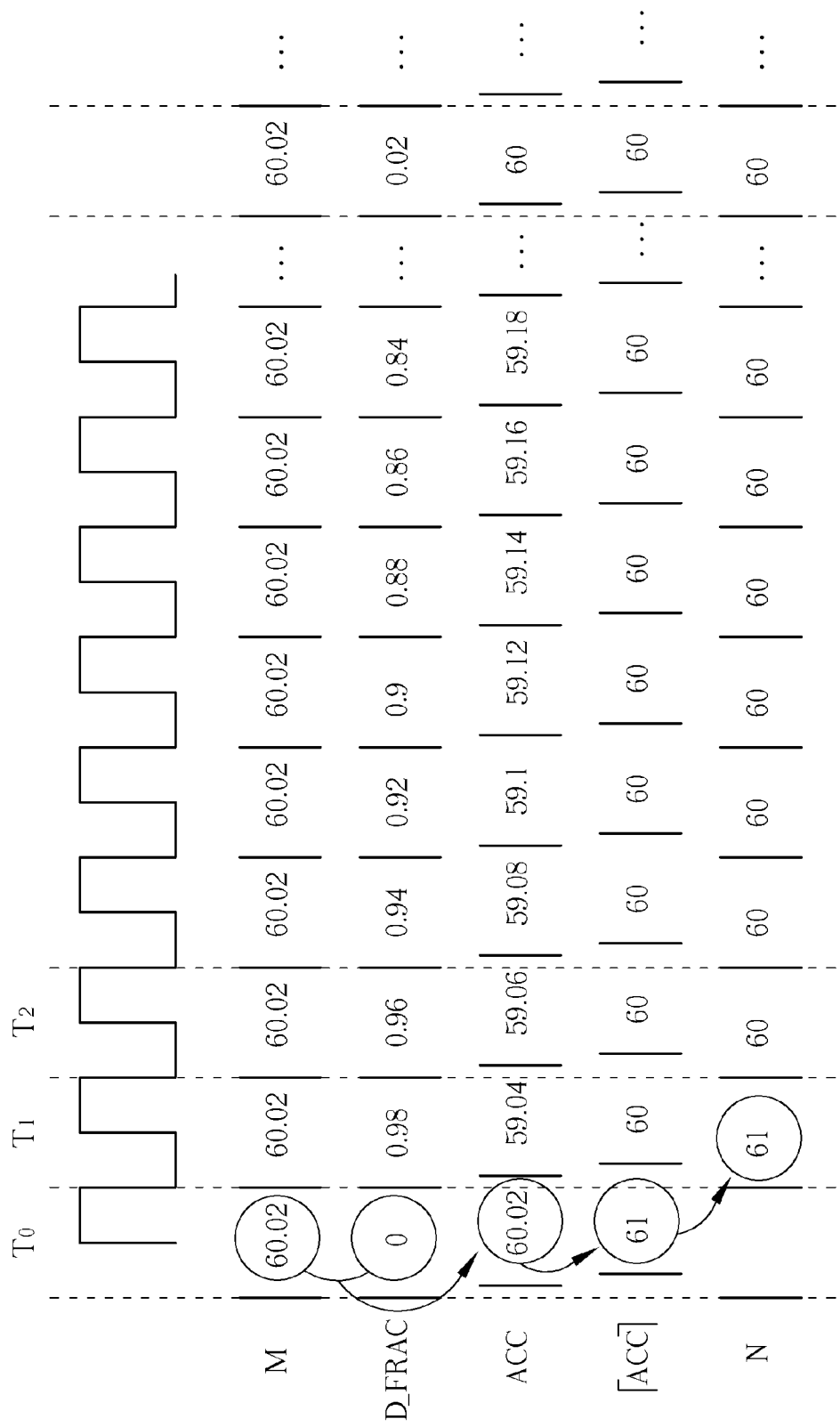
FIG. 4 is a schematic diagram of the control unit shown in FIG. 2 calculates the corresponding delay parameter and the frequency dividing parameter.

Furthermore, a frequency synthesizer 20 with a constant target magnification factor is presented as an example for explaining the operation methods of the embodiments of the present invention. The target magnification factor M is assumed to be a constant value (M=60.02), i.e. the frequency $F_{clko}$ of the output signal $S_O$ outputted by the frequency synthesizer 20 is equal to 60.02 times the frequency $F_{refclk}$ of the reference signal $S_{REF}$. Please refer to FIG. 4, which is a schematic diagram of the control unit 206 shown in FIG. 2 calculating the corresponding delay parameter D and the frequency dividing parameter N. Assume the initial value of the delay set value D_FRAC is zero. The count value ACC equals the difference between the target magnification factor M and the delay set value D_FRAC (ACC=M−D_FRAC). A difference between the count value ACC of each period and a next integer (i.e. the absolute value of the decimal part of the count value ACC minus 1, the decimal part of |ACC−1|), equals the delay set value D_FRAC of next period. Besides, the round-up value of the count value ACC calculated in each period equals the frequency dividing parameter N of next period. The delay parameter D equals a difference between the delay set value D_FRAC of current period and the delay set value D_FRAC of next period. For example, in the time period $T_0$, the target magnification factor M is 60.02, the delay set value D_FRAC is 0. The count value ACC then is 60.02 (60.02−0=60.02). As a result, the count value ACC of the time period $T_1$ is 0.98 (the decimal part of |0.02−1|). Besides, since the target magnification factor M is 60.02, the frequency dividing parameter N of the time period $T_1$ is 61 (⌈60.02⌉=61) and the delay parameter D is 0.98 (0.98−0=0.98). Thus, when the target magnification factor M is fixed to 60.02, the frequency dividing parameter N and the delay parameter D are changed with time and respectively are [61, (0.98−0)], [60, (0.96−0.98)], [60, (0.94−0.96)], . . . , [60, (0.02−0.04)]. In other words, when the delay unit 202 is configured at the input terminal REF, the delay unit 202 outputs the reference signal $S_{REF}$ to the phase-locked loop 204 by contiguously shifting the reference signal $S_{REF}$ with 0.02 times the period $T_{clko}$ of the output signal SO ahead (i.e. 0.02×$T_{clko}$). When the delay set value D_FRAC becomes zero and cannot be shifting ahead, the frequency dividing N increases one and the delay set value D_FRAC is reset to $0.98 \times T_{clko}$. As a result, via the control unit 206 outputs the calculated delay parameter D and the frequency dividing parameter N to the delay unit 202 and the frequency divider 208, the delay unit 202 and the frequency divider 208 can accordingly provides required signal frequency. As can be seen from FIG. 4, the present invention achieves fractional-number frequency synthesizing via adjusting the delay operations of the delay unit 202. The phase error and the phase error generated in the process of the recursive locking are therefore extremely small. Thus, the structure of the present invention does not need to additionally increase the capacitance in the loop filter 306 shown in FIG. 3 for suppressing jitter noise.

Figure 5:
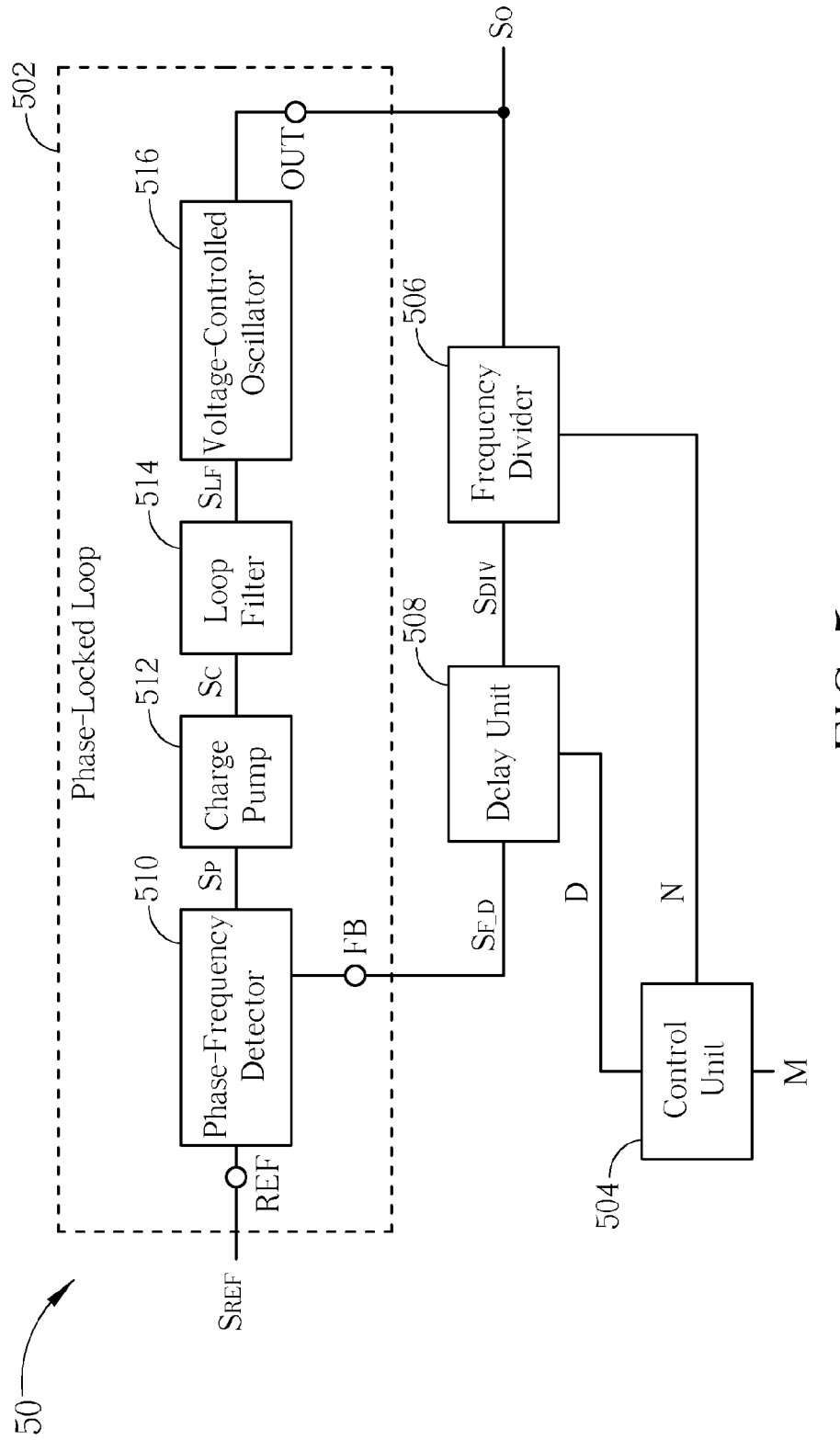
FIG. 5 is a schematic diagram of a frequency synthesizer according to a second embodiment of the present invention.

Please refer to FIG. 5, which is a schematic diagram of frequency synthesizer 50 according to a second embodiment of the present invention. The frequency synthesizer 50 includes a phase-locked loop 502, a control unit 504, a frequency divider 506 and a delay unit 508. The phase-locked loop 502 includes a phase frequency detector 510, a charge pump 512, a loop filter 514, and a voltage-controlled oscillator 516. Note that, the components with the same symbols in the frequency synthesizer 20 shown in FIG. 2 and the frequency synthesizer 50 shown in FIG. 5 have similar operation methods and functions, thus are not described herein for brevity. The connections between the components with the similar functions are shown as FIG. 5, and are not described herein for brevity. Different from the frequency synthesizer 20 shown in FIG. 2, the delay unit 508 of the frequency synthesizer 50 is coupled between a feedback terminal FB of the phase-locked loop 502 and the frequency divider 506. As shown in FIG. 5, the phase-locked loop 502 includes a reference input terminal REF, a feedback terminal FB and an output terminal OUT. The phase-locked loop 502 is utilized for generating an output signal $S_O$ according to a reference signal $S_{REF}$ and a feedback delayed signals $S_{F\_D}$. The control unit 504 is utilized for generating a delay parameter D and a frequency dividing parameter N according to a target magnification factor M. According to different applications, the target magnification factor M may be a fixed constant or a time variable. Preferably, the target magnification factor M is a positive real number greater than one, and can be a fractional-number. The frequency divider 506 is utilized for dividing the frequency of the output signal $S_O$ according to the frequency dividing parameter N, to generate corresponding frequency dividing signal $S_{DIV}$. The frequency dividing parameter N may be a frequency dividing ratio. The delay unit 508 is utilized for delaying the frequency dividing signal $S_{DIV}$ according to the delay parameter D, to generate the feedback delayed signal $S_{F\_D}$. The delay parameter D may be a delay phase. Similarly, if the frequencies of the reference signal $S_{REF}$ and the output signal $S_O$ are frequencies $F_{refclk}$ and $F_{clko}$, respectively, the present invention can output the output signal $S_O$ with required frequency at the output terminal OUT of the phase-locked loop 502 via the operations of the frequency synthesizer 50. In other words, the frequency $F_{clko}$ of the output signal $S_O$ outputted by the frequency synthesizer 50 finally equals a product of the target magnification factor M and the frequency $F_{refclk}$ of the reference signal $S_{REF}$.

On the other hand, the frequency synthesizer of the present invention is suitable for all kinds of frequency synthesizer with phase-locked loop structure. The phase-locked loop 502 shown in FIG. 5 is an exemplary implement of the present invention. The one with ordinary skill can accordingly observe different alternations and modifications, and is not limited herein.

Further, the following utilizes the frequency synthesizer 50 with a fixed target magnification factor M as an example for explaining the operation methods of the embodiment of the present invention. The target magnification factor M is assumed to be a fixed value (M=60.02), i.e. the frequency $F_{clko}$ of the output signal $S_O$ outputted by the frequency synthesizer 550 equals 60.02 times the frequency $F_{refclk}$ of the reference signal $S_{REF}$. Assuming the initial value of the delay set value D_FRAC is zero, the count value ACC equals a sum of the target magnification factor M and the delay set value D_FRAC. The decimal part of the count value ACC of each period equals the delay set value D_FRAC of next period. Besides, the round-up value of the count value ACC of each period equals the frequency dividing parameter D of next period. The delay parameter D equals a difference between the delay set value D_FRAC of current period and the delay set value D_FRAC of next period. When the target magnification factor M is fixed to 60.02, the frequency dividing parameter N and the delay parameter D are changed with time and respectively are [60, (0.02−0)], . . . , [60, (0.98−0.96)], [61, (0−0.98)]. In other words, when the delay unit 508 is configured at the feedback terminal FB of the phase-lock loop 502, the delay unit 508 contiguously holds back to output the frequency dividing signal $S_{DIV}$ to the phase-locked loop 502 (i.e. outputs the feedback delayed signal SF_D to the phase-locked loop 502) with 0.02 times the period time $T_{clko}$ of the output signal SO (i.e. $0.02 \times T_{clko}$). When the delay set value D_FRAC reaches to 1, i.e. the delay status exceeds a period $T_{clko}$ of the output signal $S_O$, the frequency dividing parameter N increases one and the delay set value is reset to ($0 \times T_{clko}$). Thus, the frequency synthesizer 50 can provide the required signal frequency via the control unit 504 outputs the calculated delay parameter D and the frequency dividing parameter N to the delay unit 508 and the frequency divider 506.

Further, as to the operations of the delay unit 202 delays the reference signal SREF according to the delay parameter D, there are various circuit structures for realizing the delay unit 202. For example, please refer to FIG. 6 and FIG. 7, which are schematic diagrams of frequency synthesizers 60, 70 according to embodiments of the present invention. Note that, the components with the same symbols in FIGS. 3, 6 and 7 have similar operation methods and functions, thus are not described herein for brevity. The connections between the components with the similar functions are shown as FIG. 6 and FIG. 7, and are not described herein for brevity. Different from FIG. 3, the frequency synthesizer 60 shown in FIG. 6 further includes a delay-locked loop 602. The delay-locked loop 602 is coupled to the output terminal OUT of the phase-locked loop 204 and the control unit 206 for generating a delay stage DS according to the output signal $S_O$. The delay elements in the delay-locked loop 602 and the delay unit 202 of the frequency synthesizer 60 have the same delaying characteristic or have relative (multiple) delaying characteristic. The delay stage DS equals the number of delay stages required for realizing a delay time equaling the period of the output signal $S_O$. After generating the corresponding delay parameter D, the control unit 206 calculates the frequency delay parameter DC according to the delay stage DS and the delay parameter D to the delay unit 202. The delay unit 202 therefore performs the corresponding delay process according to the delay stage DC. For example, if the delay-locked loop 602 calculates the delay stage DS is 10 stages, which means the period of the output signal SO equals a delay time of 10 delay line stages of the delay-locked loop 602. When the delay parameter D generated by the control unit 206 is 0.02 $T_{clko}$, the frequency dividing delay stage DC equals 0.2 stage (0.02×10). In such a condition, the delay unit 202 can perform delaying process of 0.2 stage according to the frequency dividing delay stage DC, to generate the required signal frequency.

Figure 7:
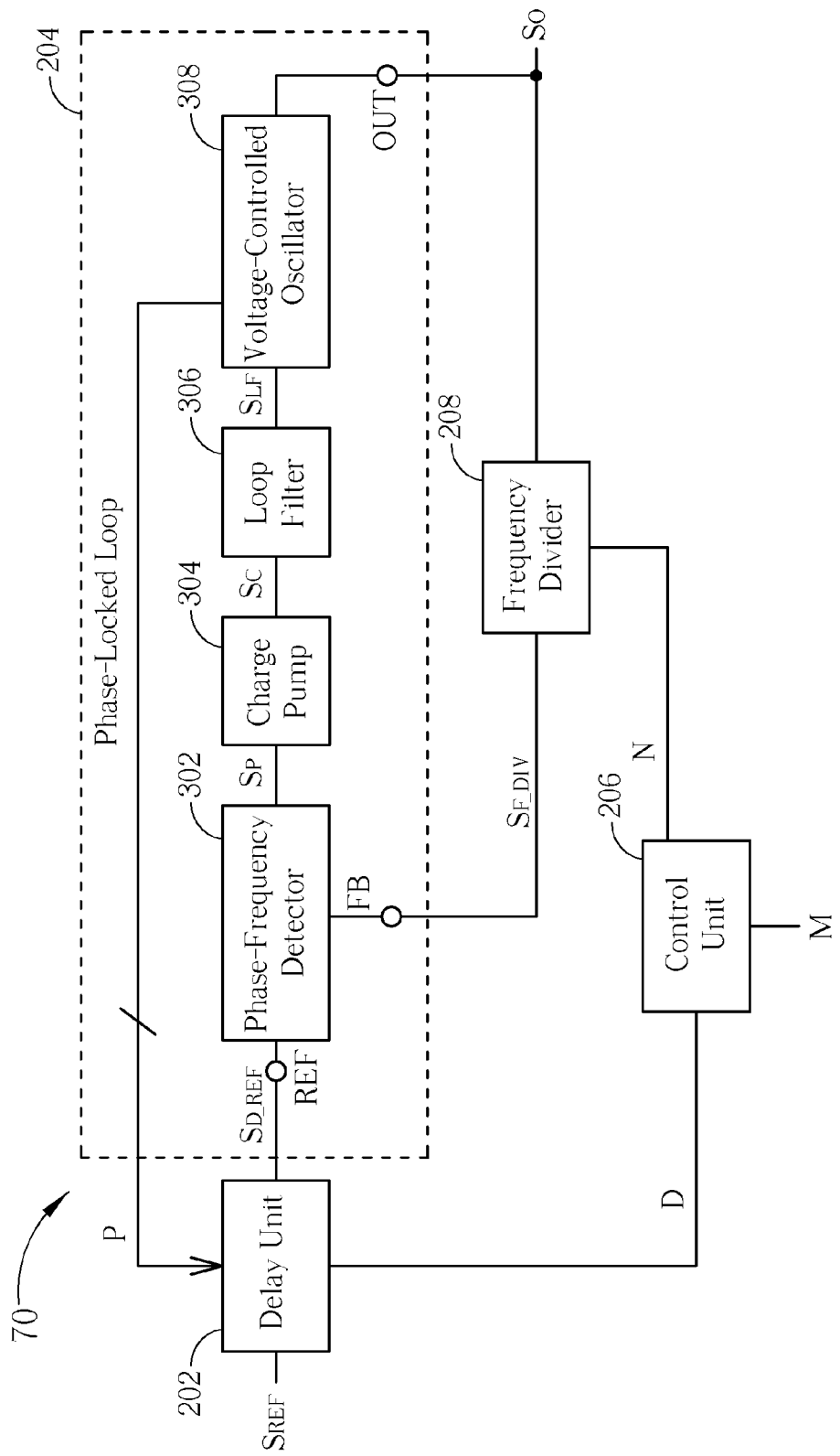

Different from FIG. 3, the voltage-controlled oscillator 308 of the frequency synthesizer 70 shown in FIG. 7 is coupled to the delay unit 202. The voltage-controlled oscillator 308 is a voltage-controlled oscillator with multiple-phase outputs. For example, the voltage-controlled oscillator 308 is a signal-ended voltage-controlled oscillator with 50 stages. The voltage-controlled oscillator 308 therefore transmits a phase stage P (P=50) to the delay unit 202. In such a condition, the delay unit 202 can re-sample the reference signal $S_{REF}$ according to the delay parameter D and the phase stage of the voltage-controlled oscillator 308, to adjust the frequency of the output signal $S_O$ for acquiring required signal frequency.

Figure 6:
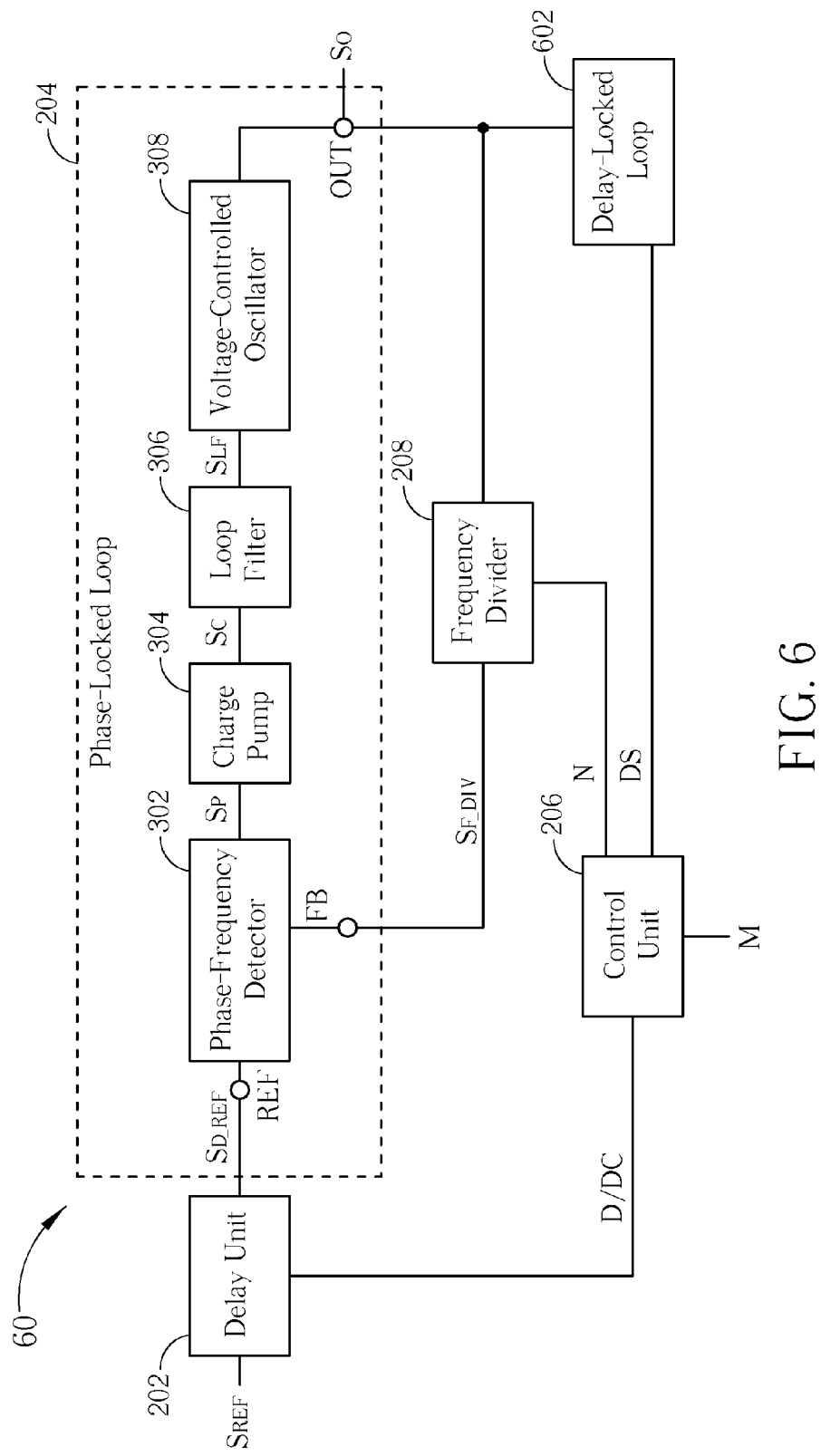
FIGS. 6-9 are respectively another schematic diagram of a frequency synthesizer according to embodiments of the present invention.
Figure 8:
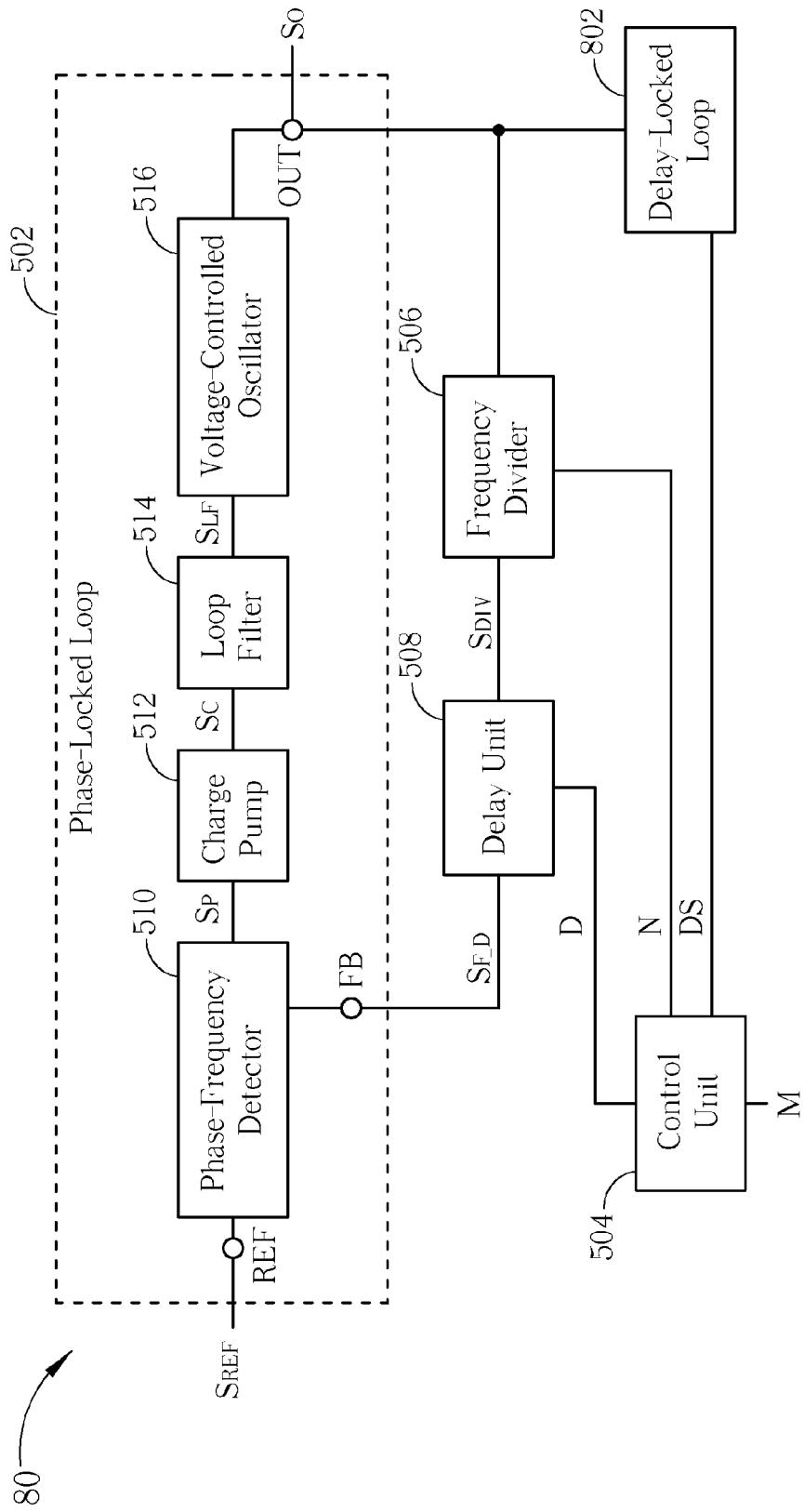
Figure 9:
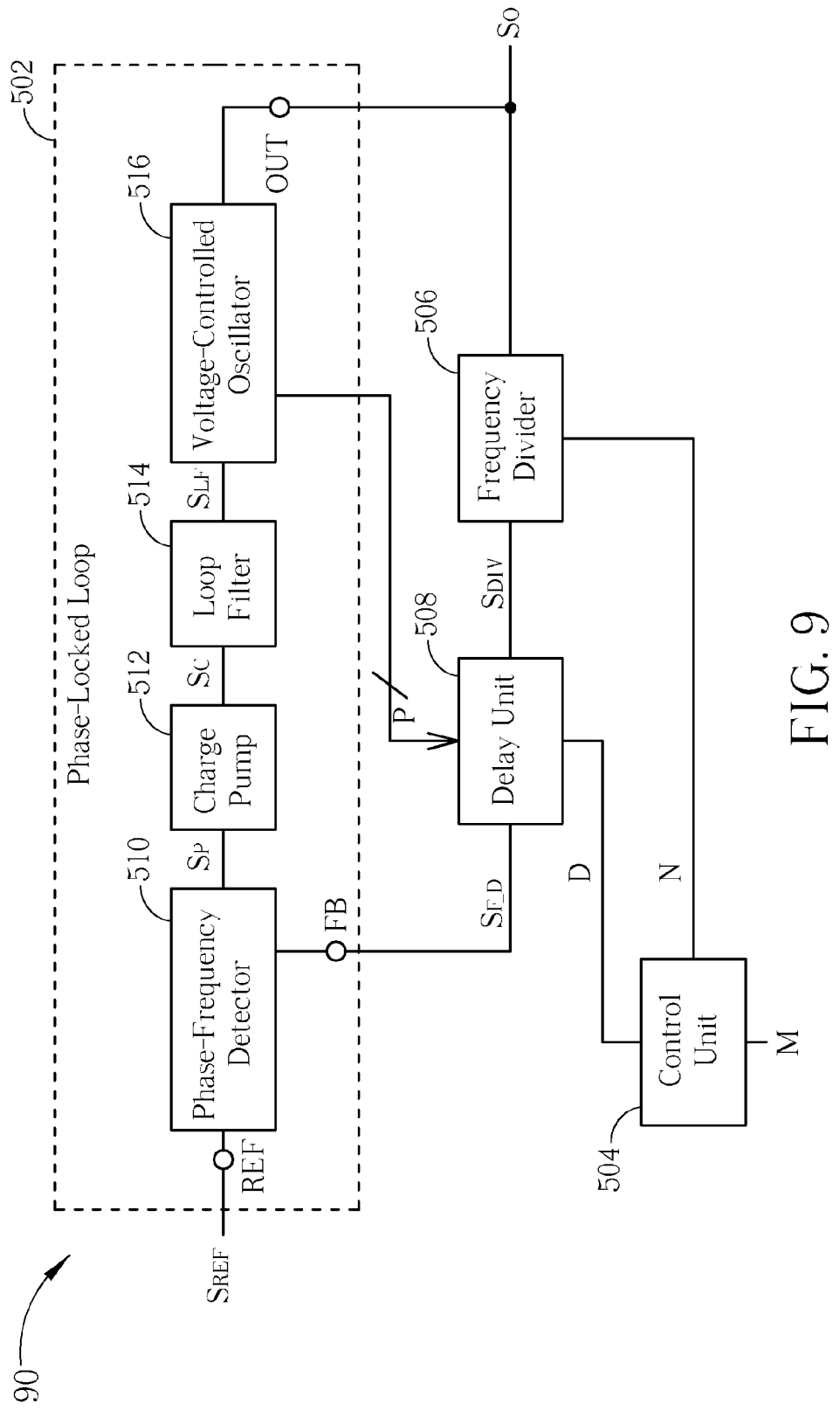

Note that, the frequency synthesizers 60 shown in FIG. 6 and the frequency synthesizers 70 shown in FIG. 7 are respectively an exemplary embodiment of the frequency synthesizer 20 shown in FIG. 3, and are also suitable for the frequency synthesizer 50, similarly. For example, the frequency synthesizers 80 and 90 shown in FIG. 8 and FIG. 9 are respectively an exemplary embodiment of the frequency synthesizer 50 shown in FIG. 5, and are not described herein for brevity.

To sum up, the frequency synthesizer of the present invention does not need to frequently vary frequency dividing ratio, thus the jitter noise can be effectively reduced. Moreover, the phase noise and the phase error generated by the delay unit of the present invention in recursive locking process are extremely small. The frequency divider of the present invention therefore has the characteristic of low jitter noise and the capability of fast locking, so as to realize the goal of synthesizing fractional-number frequency dividing ratio with high accuracy and being suitable for spread spectrum application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizer, comprising:
    a delay unit, for receiving a reference signal and delaying the reference signal according to a delay parameter, so as to generate a delay reference signal;
    a phase-locked loop, for generating an output signal according to the delay reference signal and a feedback frequency dividing signal;
    a control unit, for generating the delay parameter and a frequency dividing parameter according to a target magnification factor; and
    a frequency divider, for dividing the frequency of the output signal according to the frequency dividing parameter.

2. The frequency synthesizer of claim 1, wherein the phase-locked loop comprises:
    a phase frequency detector, for receiving the delay reference signal and the feedback frequency dividing signal, and accordingly generating a phase error signal;
    a charge pump, for generating a control voltage signal according to the phase error signal;
    a loop filter, for filtering the control voltage signal, so as to generate a filtering signal; and
    a voltage-controlled oscillator, for generating the output signal according to the filtering signal.

3. The frequency synthesizer of claim 1, wherein the delay parameter is a delay phase and the frequency dividing parameter is a frequency dividing ratio.

4. The frequency synthesizer of claim 1, wherein the control unit generates the delay parameter and the frequency dividing parameter according to the target magnification factor and a delay set value, wherein a difference between the target magnification factor and the delay set value equals a count value in each period, the delay set value of next period equals an absolute value of the decimal part of the count value minus one, the delay parameter of next period equals a difference between the delay set value of current period and the delay set value of next period, and the frequency dividing parameter of next period equals the round-up value of the count value.

5. The frequency synthesizer of claim 4, wherein an initial value of the delay set value is zero.

6. The frequency synthesizer of claim 1, wherein the target magnification factor is greater than one.

7. The frequency synthesizer of claim 1, wherein the target magnification factor is a fractional-number.

8. The frequency synthesizer of claim 1, wherein the frequency divider is a variable frequency divider.

9. The frequency synthesizer of claim 1 further comprising:
    a delay-locked loop, for generating a delay stage according to the output signal, wherein the control unit generates a frequency dividing delay stage to the delay unit according to the delay parameter and the delay stage, such that the delay unit accordingly delays the output signal for generating the delay reference signal.

* * * * *